United States Patent
Fang et al.

[11] Patent Number: 6,046,066
[45] Date of Patent: Apr. 4, 2000

[54] METHOD OF FORMING CANTILEVER STRUCTURE IN MICROELECTROMANICAL SYSTEM

[75] Inventors: Yean-Kuen Fang, Tainan; Jyh-Jier Ho, Kaohsiung Hsie; Chiun-Wei Chu, Taipei, all of Taiwan

[73] Assignee: National Science Council of Rep. of China, Taipei, Taiwan

[21] Appl. No.: 09/037,819

[22] Filed: Mar. 10, 1998

[51] Int. Cl.[7] .................................................. H01L 21/306

[52] U.S. Cl. .............................................. 438/52; 438/943

[58] Field of Search ............................ 438/52, 455, 458, 438/553, 584, 670, 671, 928, 942, 943, 945, 951, 975, FOR 374, FOR 395, FOR 405, FOR 459, FOR 473, FOR 148, DIG. 106

[56] References Cited

U.S. PATENT DOCUMENTS

| | | | |
|---|---|---|---|
| 4,071,838 | 1/1978 | Block | 216/2 |
| 4,597,003 | 6/1986 | Aine et al. | 438/52 |
| 4,670,092 | 6/1987 | Motamedi | 438/52 |

*Primary Examiner*—Olik Chaudhuri
*Assistant Examiner*—Anh Duy Mai
*Attorney, Agent, or Firm*—Bacon & Thomas

[57] ABSTRACT

The present invention relates to a new process of the cantilever structure in the micro-electro-mechanical system (MEMS), and more particularly, to a process that could overcome the contamination problem on the undesired areas during the thin-film growth. Their advantages include not only to substitute the complex technique with sacrificial layer, but also to increase the yield for its simple structure and to deal the sub-micron microelectromechanical system technology for the mature stage on the wet-etching skill.

5 Claims, 11 Drawing Sheets

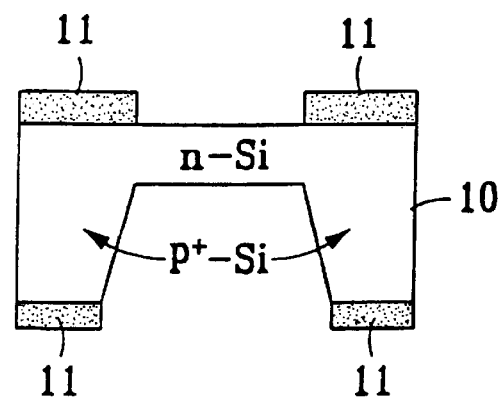
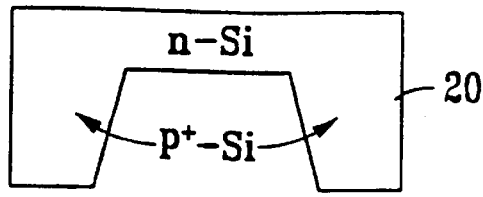
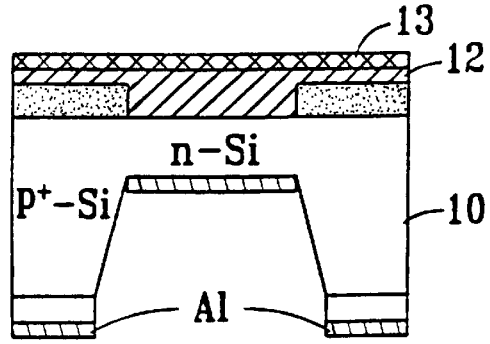
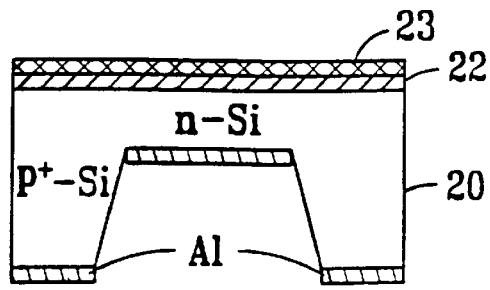
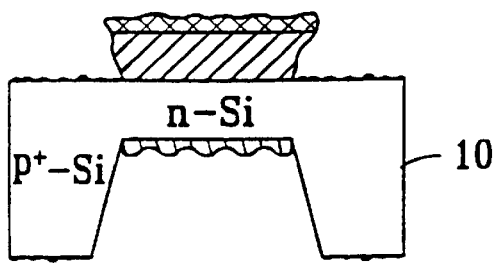
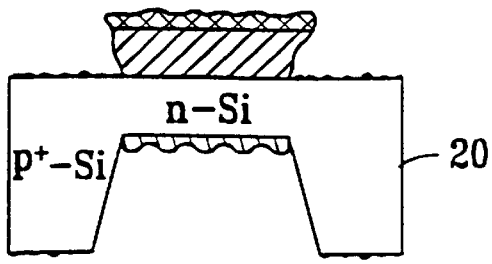
FIG. 1A
(PRIOR ART)
FIG. 1B
(PRIOR ART)

1000Å
Illustrative View of Photograph in fig.4

100 μm

Illustrative View of Photgraph in FIG.6B

1μm

Illustrative View of Photgraph in FIG.6D

METHOD OF FORMING CANTILEVER STRUCTURE IN MICROELECTROMANICAL SYSTEM

BACKGROUND OF THE INVENTION

1. Field of the invention

The present invention relates to a new process of the cantilever structure in the micro-electro-mechanical system (MEMS), and more particularly, to a process that overcomes the contamination problem on the undesired areas during the thin-film growth. Their advantages include not only to substitute the complex technique with sacrificial layer, but also to increase the yield for its simple structure and to deal the sub-micron microelectromechanical system technology for the mature stage on the wet-etching skill.

2. Description Of The Prior Art

The application of metal deposition commonly includes sputtering deposition and evaporating deposition. For the VLSI processing, how to boost the continuous developing of ladder layer and filling, especially to avoid the contaminated and destructive problems on the undesired areas during sputtering deposition will be one of major objectives today.

There are two conventional methods (as shown in FIG. 1) for the post-processing to deposit metal thin-film or oxide layer on the cantilever structures of the microelectromechanical system. The first is sacrificial layer technology as shown in FIG. 1 (A) which is made by the silicon oxide thin-film as a mask to isolate the specific deposition area, said mask isolates the area of metal thin-film 12 (PbTiO3) and 13(Bi) on the sacrificial layer 11 in MEMS 10, after the complete of sputtering deposition or evaporating deposition, finally, delete the sacrificial layer by etching skill. Another is destructive growth technology as shown in FIG. 1(B) which is to deposit metal thin-film 22(PbTiO3) and 23(Bi) on MEMS 20, then etching the undesired area separately into device size and its shape.

Those two conventional methods with drawbacks that not only increasing the mask number that easy to have the contamination problem on the undesired areas during sputtering deposition and decrease its dc signal sensitivity and ac signal response time, but also result destructive problems on the undesired area due to its complexity; besides, the main sensor section cannot be made into array repeatedly that cannot boost its sense performance also not easy to decrease its die size totally, therefore decreasing the operation speed and increasing power consumption.

Except for increasing the complexity or difficulty on the process, these two conventional methods own the result contaminated and destructive problems on the undesired areas for decreasing the operation speed and lifetime of electronic devices. Thus, at the same study for the MEMS, how to overcome these problems will be one of major objectives today.

SUMMARY OF THE INVENTION

It is therefore a primary objective of the present invention to provide a new process which major sense section based on cantilever structure of the micro-electro-mechanical system (MEMS) to overcome the contaminated problems on the undesired areas during thin-film growth. Thus, compare to conventional sacrificial layer technology and destructive growth technology, this invention more particular suitable to the low lost application of Optoelectronic Integrated Circuits which need to meet high current driving capability.

This invention includes a new process to overcome the contamination problem on the undesired area during sputtering deposition process. As shown in schematic diagram from FIG. 2, this technology use two P-Si wafer as molds to cover the undesired areas during sputtering deposition process; i.e., at first to etch the same diagrams of the top and the bottom sample, then align with microscope and attach sandwiched with silver glue to isolate the deposition area from the undesired areas; after the metal or oxide thin-film growth, finally, to separate the top and the bottom molds from a device sample. The major purpose of this technology is to avoid not only the contamination problem on the undesired area, but also the damage of the device sample during fabrication process.

In order to avoid the drawbacks of conventional sputtering deposition and reach the high efficiency target, this invention use MEMS technology to provide a new process could overcome the contamination problem on the undesired areas during metal thin-film growth. Its advantage includes not only to substitute the complex traditional technique, but also to increase the yield for its simple structure and to deal the VLSI and MEMS, more particular to deal the sub-micron MEMS technology for the mature stage on the wet-etching skill.

But the main claim of this invention is to decrease its mask procedure by simplify the process, also overcome the contamination problem on the undesired areas during metal thin-film growth. However, align the top and bottom substrate with microscope and sandwiched with silver glue need mature accurate technology to increase its yield. Thus, considering the tradeoff of those factors, this invention could not only overcome the contaminated problem, but also could repeatedly make it into an array to boost up sense performance for its simple structure and process.

Comparing to conventional sputtering deposition method, a new process based on this invention could overcome the contamination problem on the undesired areas during metal thin-film growth. And this new process has following advantages.

(1). It could improve the complex mask procedure of conventional sacrificial layer technology to VLSI and MEMS. When going on metal thin-film growth, it could increase the yield for its simple structure and process, also could reduce the sensor leakage current that is practical for real application.

(2). It could decrease the conventional separation growth technology with the advantage for device sample to avoid unnecessary destructive problem, moreover, could deal the sub-micron MEMS technology for the mature stage on wet-etching skill.

(3). It could not only decrease the element size to save power consumption, but could be made in VLSI and integrate with other function element fabricated on a same substrate into ASIC chip.

(4). The wet-etching in MEMS with low cost and simple structure for process; meantime, its sensor section could repeatedly be made into an array to increase the performance with develop-value potentially.

(5). It is easy to make an integrated optical electronic device wherein use the germanium material with low cost and large size etc. advantage, and compatible with current VLSI technology for its silicon based materials.

BRIEF DESCRIPTION OF THE DRAWINGS

The drawings disclose an illustrative embodiment of the present invention Which serves to exemplify the various advantages and objects hereof, and are as follows:

FIG. 1 is the sputtering deposition process of cantilever structure of the micro-electro-mechanical system (MEMS).

Deposition rate is 10° A/min, growth time is 100 minutes, deposition thickness is 1000° A(~0.1 um); other growth condition include its atomicity ratio Ti:Pb=1:1.12, substrate growth pressure/temperate is 10 mTorr/580° C., substrate distance is 5 cm, sputtering power is 50 Watt.

FIG. 6 is example of PbTiO3 thin-film infrared sensor in cantilever structure of the micro-electro-mechanical system (MEMS). FIG. (A) and FIG. (C) is the front elevation and side view to the SEM of sensor in cantilever structure of the micro-electro-mechanical system (MEMS). FIG. (B) and FIG. (D) is the related photo to FIG. (A) and FIG. (B) respectively.

Figure 7:
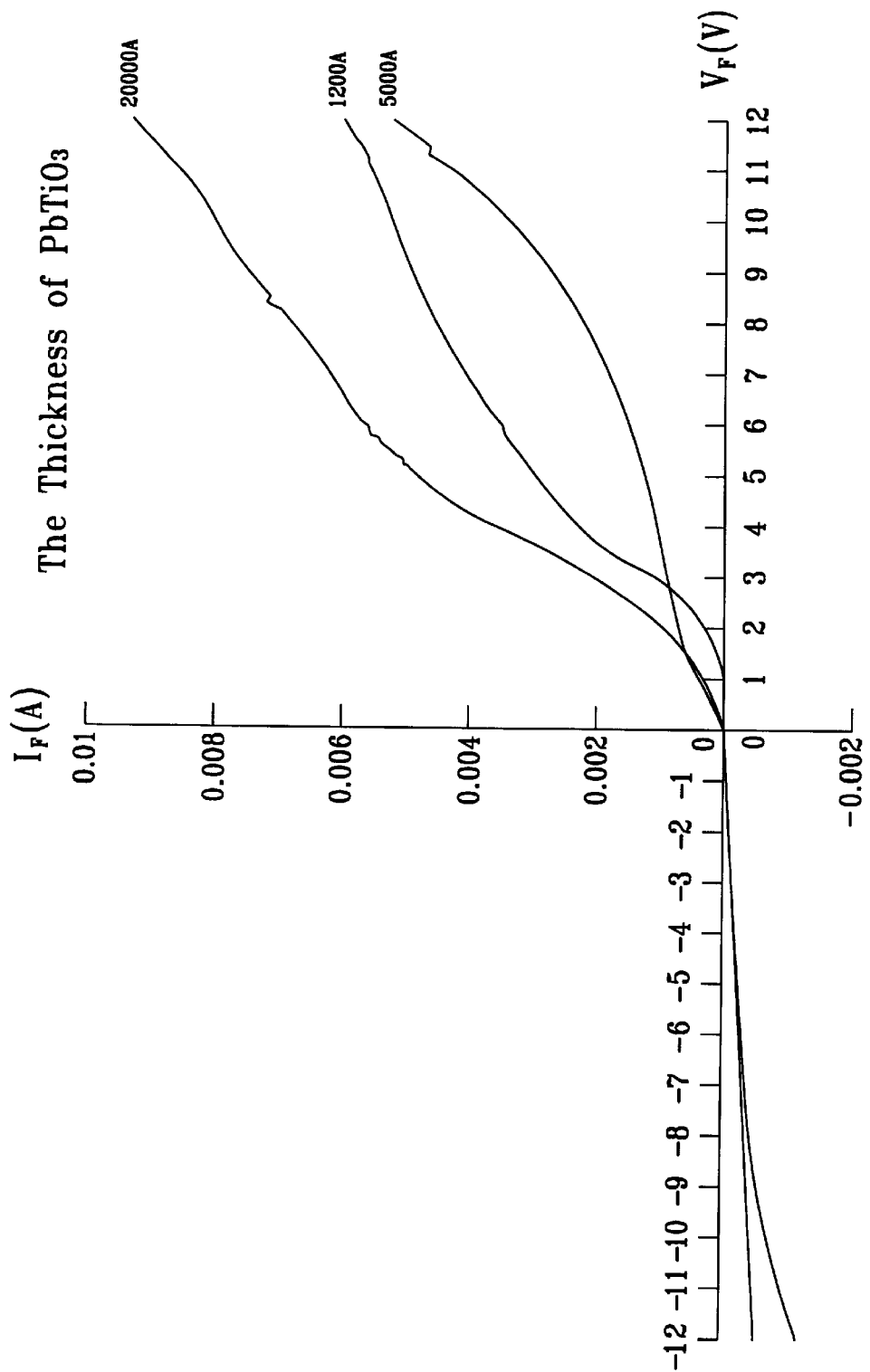

FIG. 7 is the V-I characteristics curve based on different thickness of PbTiO3 thin-film layer to the present invention.

Figure 8:
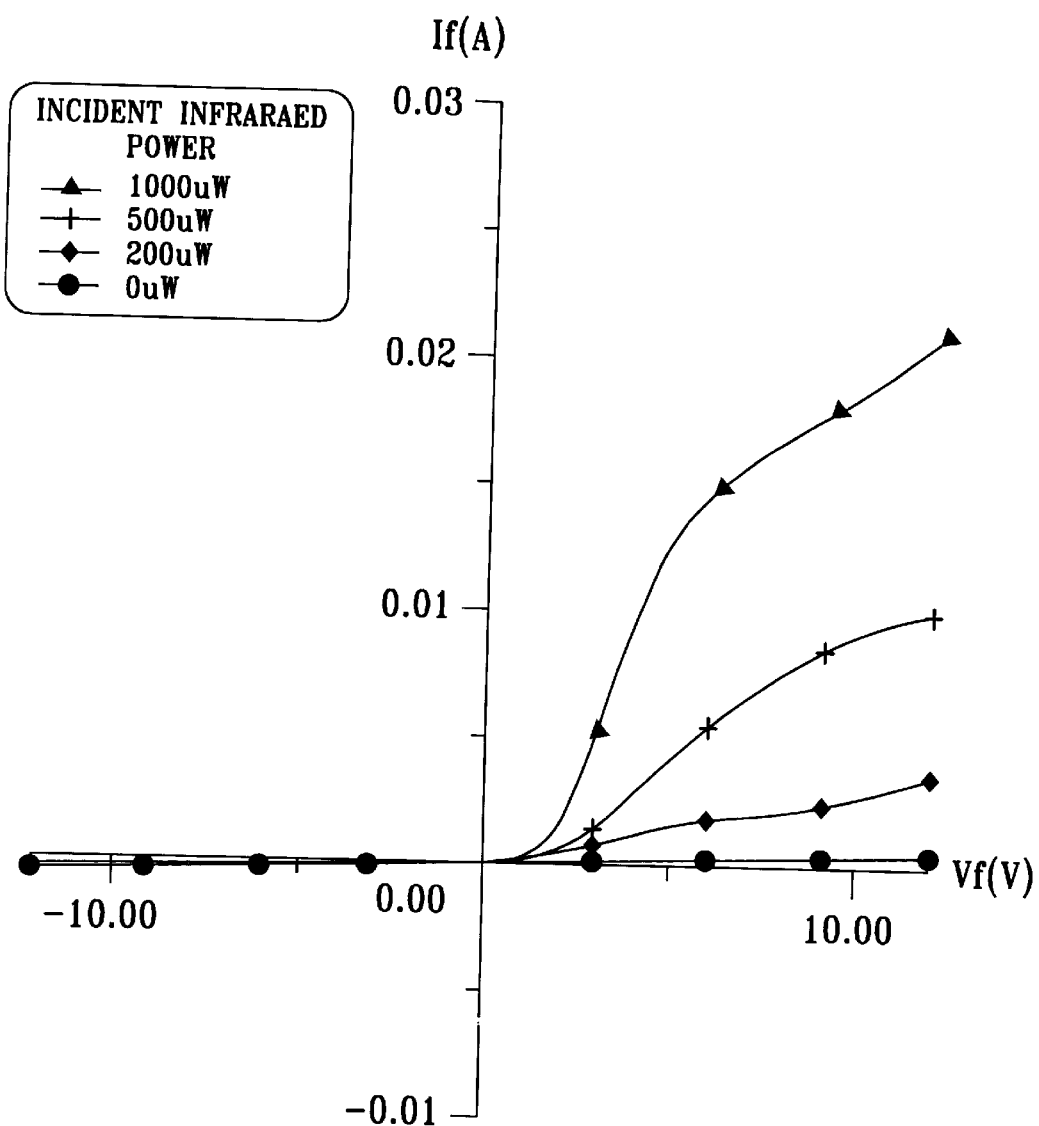

FIG. 8 is the V-I characteristics curve under different infrared strength of final device sample to the present invention wherein wave length of inject light by the laser diode is 910 nm-power strength is 5mW.

DETAILED DESCRIPTION OF THE PREFERRED EMBODIMENT

Please refer to FIG. 2 that relates to the process procedures to present invention.

Figure 2A:
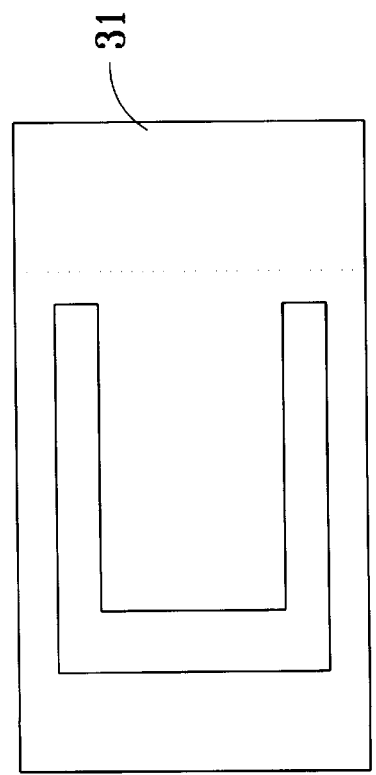
FIG. 2 is the technical diagrammatic view relates to overcome the contamination problem on the undesired area during sputtering deposition process.
Figure 2B:
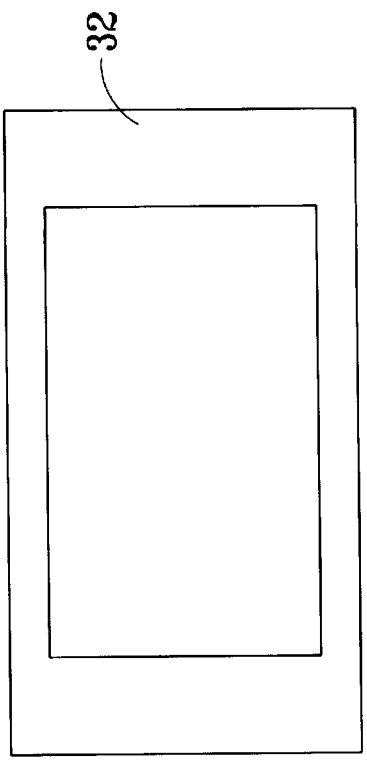

(1) First, preparing two p-Si wafers as silicon wafer molds which are mounted on a sample and the same pattern is formed in each by wet-etching technology, as shown in diagram FIG. 2(A) and FIG. 2(B).

Figure 2C:
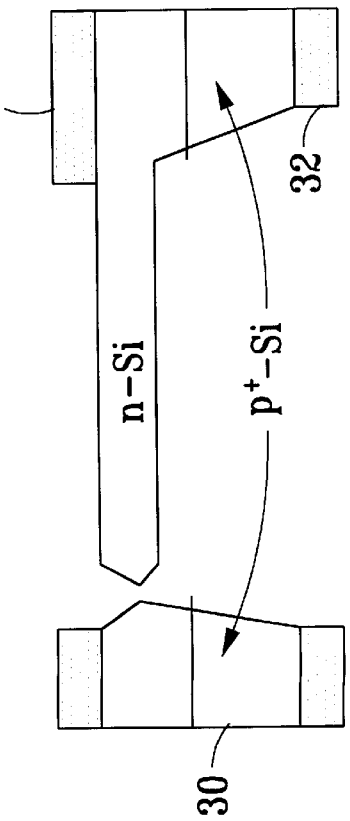

(2). As shown in FIG. 2(C), align the mold 31 and 32 with microscope and attach to the top and bottom of device sample with silver glue, perform the step of thin metal film growth.

Figure 2D:
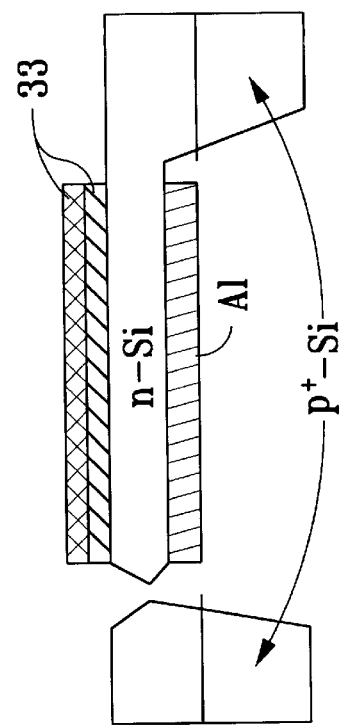

(3). As shown in FIG. 2(D), after the metal(PbTiO3, Al, Bi etc.) thin-film 33 growth, finally separate the silicon wafer mold 31,32 and device sample 30.

Just as described above, the P-Si wafer could be the silicon wafer mold in present invention (resistance is 3–4 ohm, thickness is around 4–5 um). That means paste the photo-resistance and copper to the same diagram of top and bottom of device sample 30, followed by wet-etching skill to make two same diagram silicon wafer mold 31,32 as the top and bottom of device sample30. Then align these two silicon wafer mold 31,32 with microscope and attached to top and bottom of device sample 30 with silver glue, and proceed the metal thin-film growth. Finally, the sense film and cathode-anode of MEMS has completed, could go on the other process.

Etching technology normally means wet-etching skill by EDP solvent (Ethlenediamine:120 ml, Pyrocatechol:20 g, DIWater: 60 ml, T=100° C., EtchRate=72 um/hour), and silver glue could pasted on the undesired areas. After the metal thin-film growth by sputtering deposition, it could separate the silicon wafer mold and device sample just by some force on the pasted area. If have destructive or contaminated problems, its glued section is located on undesired area however, therefore, there is no destructive and contaminated problems by silver glue just directly going on dicing when packing.

Figure 3:
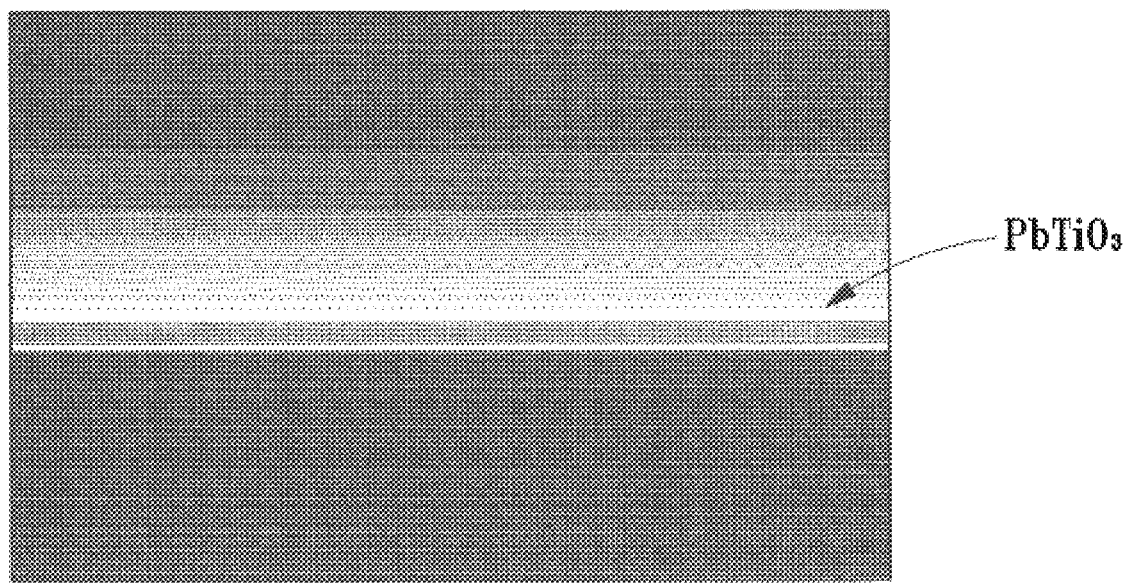
FIG. 3 is the process procedures of PbTiO3 thin-film infrared sensor in cantilever structure of the micro-electro-mechanical system (MEMS).
Figure 4:
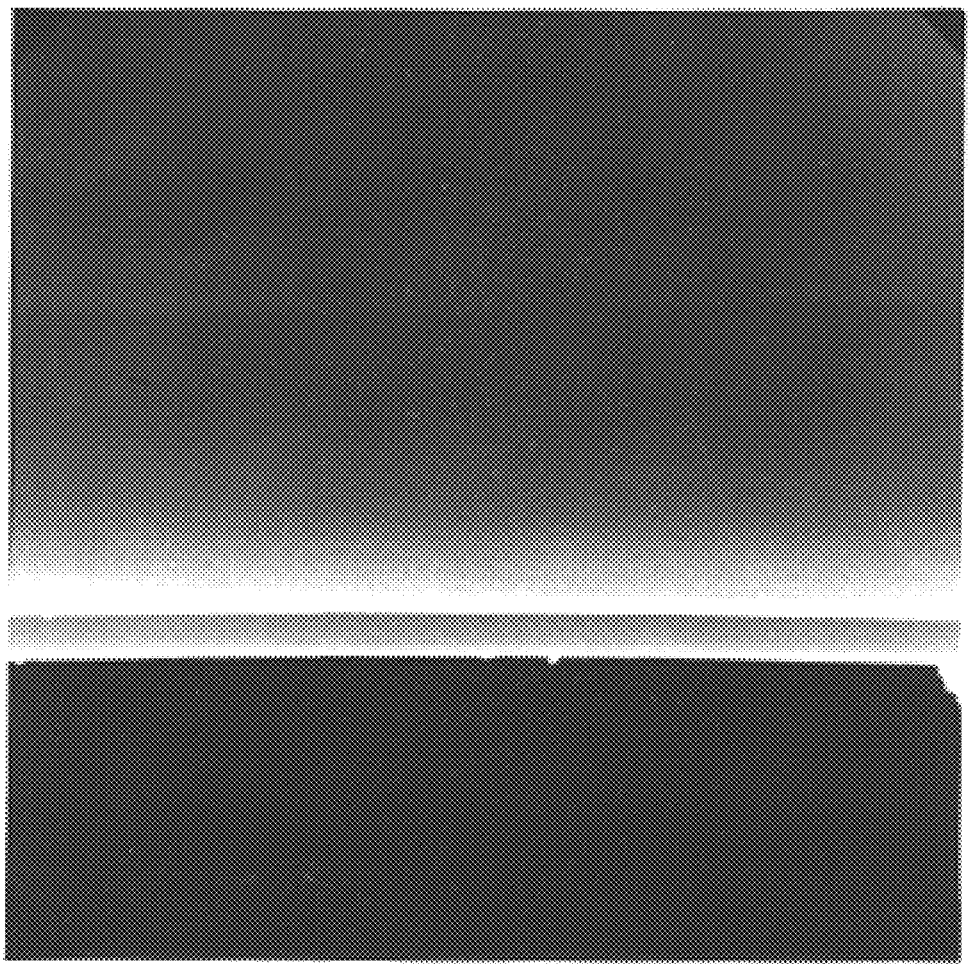
FIG. 4 is the attached photo of the process procedures of PbTiO3 thin-film infrared sensor in cantilever structure of the micro-electro-mechanical system (MEMS).
Figure 5D:
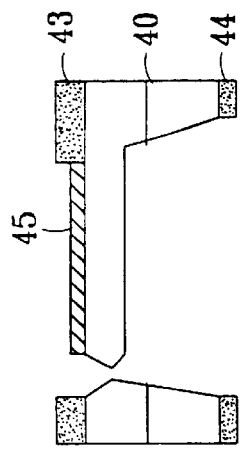
FIG. 5 is the SEM side elevation during PbTiO3 thin-film sputtering deposition.
Figure 5E:
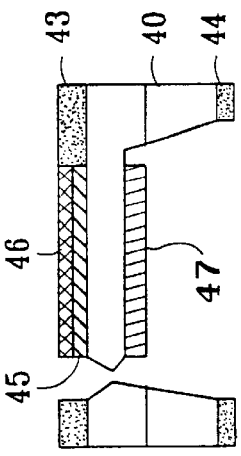
Figure 5F:
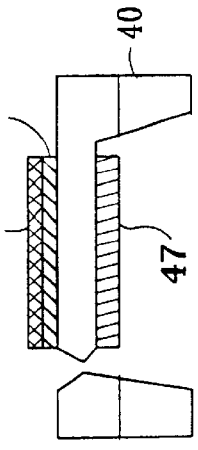
Figure 5A:
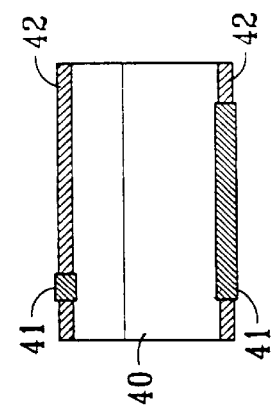
Figure 5B:
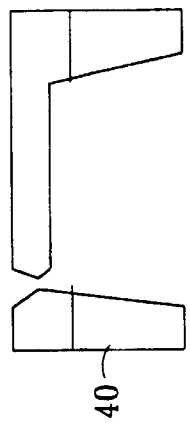
Figure 5C:
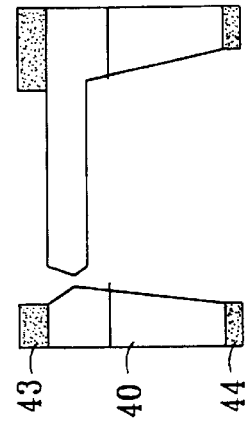
Figure 6A:
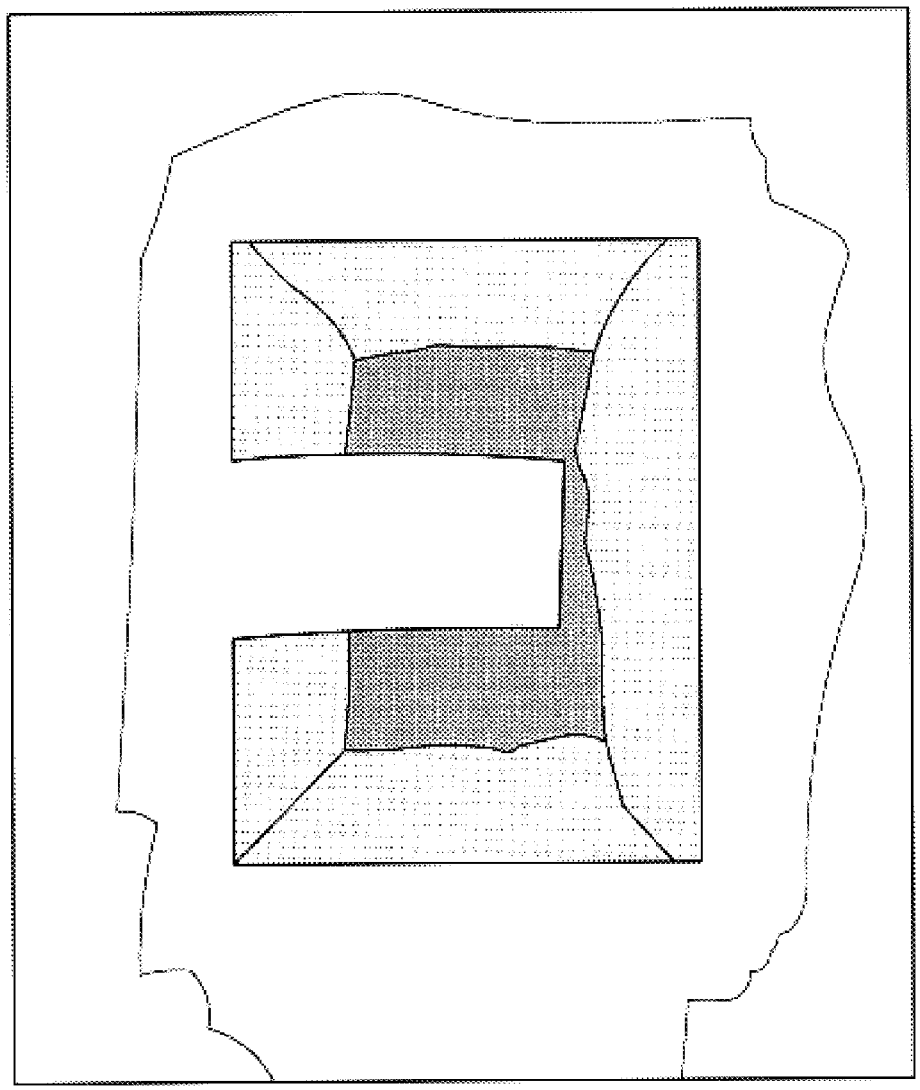
Figure 6B:
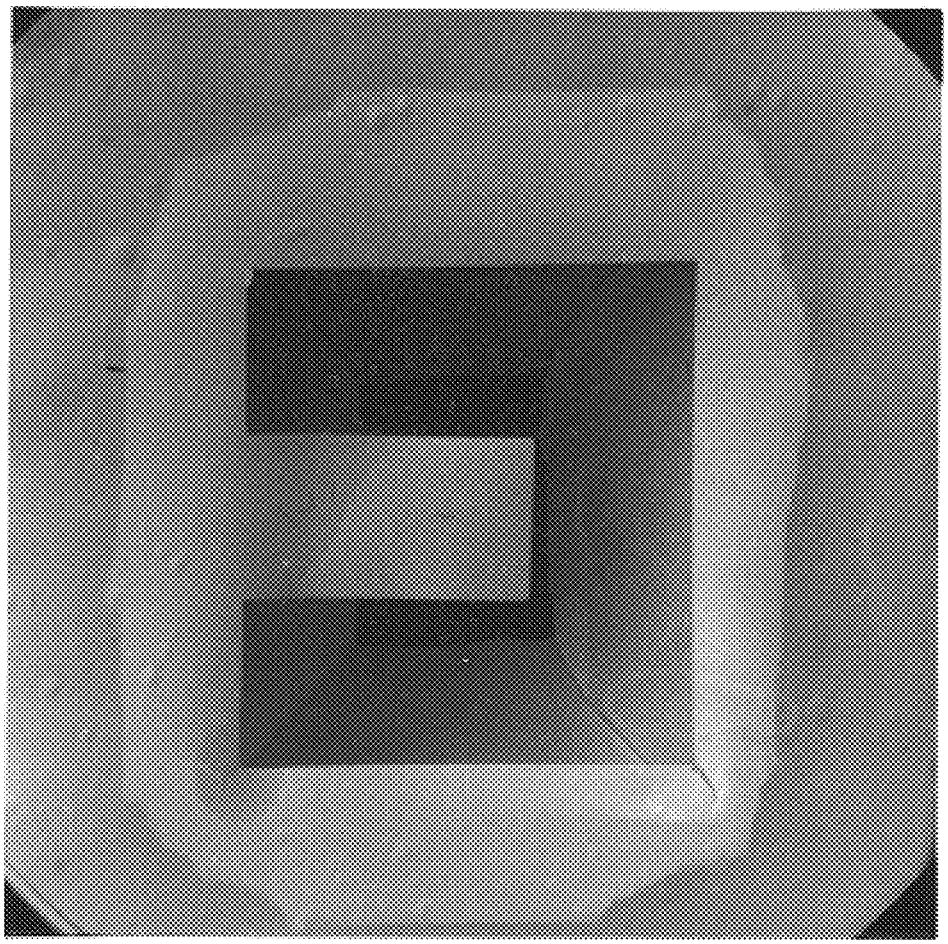
Figure 6C:
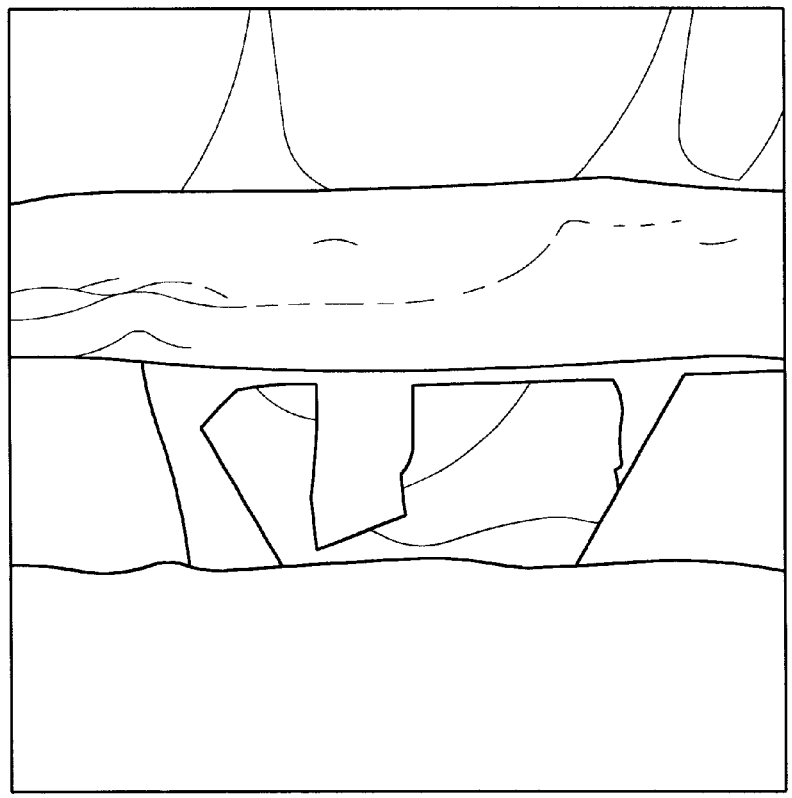
Figure 6D:
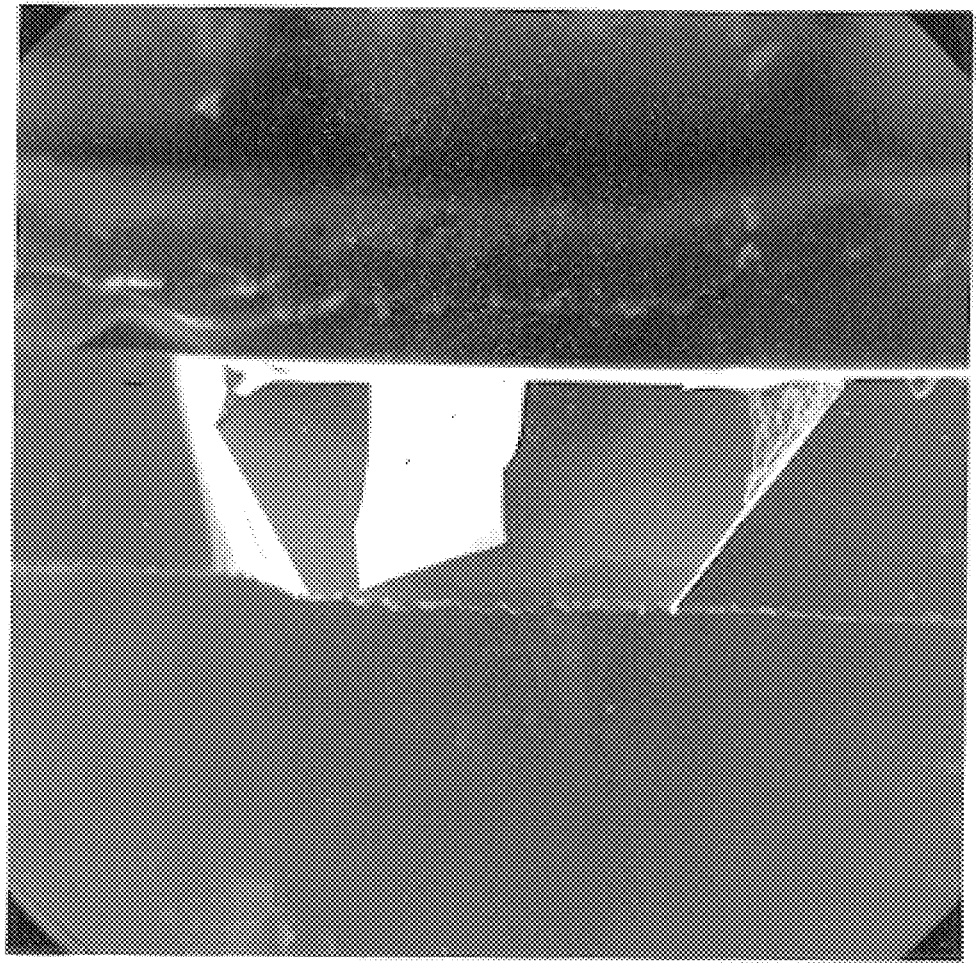

As regards different thin-film growth, it could use the optimize deposition rate of this invention. Take the growth condition of PbTiO3 as an example, atomicity is Ti:Pb=1:1.12, pressure/temp of substrate growth is 10 mTorr/580° C., air flow is Ar:100 sccm and O2:10 sccm separately during sputtering deposition. The deposition rate of PbTiO3 thin-film is 10 A/min under this condition. The SEM section view of PbTiO3 thin-film as shown in FIG. 3 (please refer to the photograph on FIG. 4), its deposition thickness is 1000 A(=0.1 um) when 100 minutes deposition.

Following is the detailed description of the preferred embodiment. Take the infrared sensor device with PbTiO3 thin-film in MEMS as example. Please refer to the procedure shown in FIG. 5, its procedure content as follows:

(a). Please refer to FIG. 5(A), first, prepare the monolithic n-Si/P-Si wafer which has growth in advance as the substrate 40 and go on cleaning, then locate the mask on the top and bottom of this substrate, deposit copper 42 after pasting the photoresist 41.

(b). Please refer to FIG. 5(B), carry on the wet-etching by EDP chemical solvent(i.e. Ethlenediamine:120 ml, Pyrocatechol:20 g, DI Water: 60 ml, T=100° C., EtchRate=72 um/hour) and setup the active cantilever sense area size, the effective area of cantilever section is 300×100 um, thickness is 3 um.

(c). Please refer to FIG. 5(C), prepare two P-Si wafer as molds 43 and 44 and etching into same diagram by mask according to the procedures (b)-(c), then align with top and bottom of substrate with microscope and attached with silver glue to isolate the deposition area.

(d). Please refer to FIG. 5(D), go on PbTiO3 thin-film 45 growth by sputtering deposition machine controlled by RF magnetic method, deposition thickness is 1000 A.

(e). Please refer to FIG. 5(E), go on Bi growth as anode 46 onto PbTiO3 thin-film by way of E-gun evaporation method, meantime, go on the Al growth as cathode 47 at back side of cantilever device.

(f). Please refer to FIG. 5(F), finally, separate the top and bottom molds 43,44 from device sample and finish the wiring test.

As shown in FIG. 3, the growth thickness of PbTiO3 need an optimized value when infrared sensing. It will breakdown due to the large input voltage if the film is too thin, otherwise, current cannot penetrate if film is too thick. Through many testing, the PbTiO3 thickness of 1000 A is the proper value to get the best light intensity.

As shown in FIG. 6, this is an example of PbTiO3 thin-film infrared sense device with cantilever structure of MEMS. Please refer to FIG. 6(A), FIG. 6(C) and the photographs on FIG. 6(B), FIG. 6(D), it indicates the front elevation and side elevation to the SEM of sensor in cantilever structure of the micro-electro-mechanical system (MEMS) based on present invention that overcome the contaminated problem on the undesired areas.

As shown in FIG. 7, this is the V-I characteristics curve based on different thickness of PbTiO3 thin-film layer to the present invention, the V-I curve is better when thin-film is thicker.

As shown in FIG. 8, this is the V-I characteristics curve under different infrared strength of final device sample to the present invention wherein wave length of inject light by the laser diode is 910 nm-power strength is 5 Mw. the sensitivity (I/Idark ratio) reach 64 when 100 uw wherein Idark means dark current when inject light power equal 0 W.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for forming a cantilever layer in MEMS to prevent contamination, comprising:

placing two p-Si wafers as molds to cover an undesired area of a device during processing; etching a pattern on top and bottom of said two p-Si wafers wherein the pattern is the same, then aligning and forming a sandwich with silver glue adhering the p-Si wafers to the device to isolate the deposition area; growing a metal or metal oxide thin film on said device, after the metal or oxide thin-film growth, separating the top and bottom molds from the device, thereby overcoming the contamination problem on the undesired area.

2. A method of the cantilever layer in MEMS as claimed in claim 1, wherein the two silicon molds are made of one layer or multi-layers of monolithic or polymorphous silicon.

3. A method of the cantilever layer in MEMS as claimed in claim 2, wherein the pattern on the silicon mold is etched by EDP solution or physical etching technology.

4. A method of the cantilever layer in MEMS as claimed in claim 1, wherein the sandwich structure from top to bottom comprises mold/n-Si-device/mold.

5. A method of the cantilever layer in MEMS as claimed in claim 1, wherein the growth of metal thin-film is completed by physical or chemical depositing.

* * * * *